US007863516B2

(12) United States Patent
Fafard

(10) Patent No.: US 7,863,516 B2
(45) Date of Patent: Jan. 4, 2011

(54) SOLAR CELL WITH EPITAXIALLY GROWN QUANTUM DOT MATERIAL

(75) Inventor: Simon Fafard, Ottawa (CA)

(73) Assignee: Cyrium Technologies Incorporated, Ottawa, Ontario (CA)

(*) Notice: Subject to any disclaimer, the term of this patent is extended or adjusted under 35 U.S.C. 154(b) by 1171 days.

(21) Appl. No.: 11/038,230

(22) Filed: Jan. 21, 2005

(65) Prior Publication Data

US 2005/0155641 A1 Jul. 21, 2005

Related U.S. Application Data

(60) Provisional application No. 60/537,259, filed on Jan. 20, 2004.

(51) Int. Cl.
*H02N 6/00* (2006.01)
(52) U.S. Cl. .................. 136/249; 136/252; 136/255; 136/256; 136/261; 136/262; 257/437; 257/458; 257/461
(58) Field of Classification Search ........... 136/249, 136/252, 255, 256, 261, 262; 257/437, 458, 257/461
See application file for complete search history.

(56) References Cited

U.S. PATENT DOCUMENTS

| 4,206,002 A | 6/1980 | Sabnis et al. |
|---|---|---|
| 4,419,530 A | 12/1983 | Nath |
| 4,575,577 A | 3/1986 | Fraas |
| 4,667,059 A | 5/1987 | Olsen |
| 4,688,068 A | 8/1987 | Chaffin et al. |
| 4,694,115 A | 9/1987 | Lillington et al. |
| 5,009,719 A | 4/1991 | Yoshida |
| 5,019,177 A | 5/1991 | Wanless |
| 5,223,043 A | 6/1993 | Olsen et al. |
| 5,330,585 A | 7/1994 | Chang et al. |
| 5,405,453 A | 4/1995 | Ho et al. |
| 5,407,491 A | 4/1995 | Freundlich et al. |
| 5,614,435 A | 3/1997 | Petroff et al. |

(Continued)

FOREIGN PATENT DOCUMENTS

CN 1272225 11/2000

(Continued)

OTHER PUBLICATIONS

S. Fafard, et al., "Manipulating the Energy Levels of Semiconductor Quantum Dots", Phys. Rev. B 59, (1999) pp. 15368-15373.

(Continued)

*Primary Examiner*—Alexa D Neckel
*Assistant Examiner*—Xiuyu Tai
(74) *Attorney, Agent, or Firm*—Louis B. Allard; Borden Ladner Gervais LLP

(57) ABSTRACT

A monolithic semiconductor photovoltaic solar cell comprising a plurality of subcells disposed in series on an electrically conductive substrate. At least one subcell of the plurality of subcells includes an epitaxially grown self-assembled quantum dot material. The subcells are electrically connected via tunnel junctions. Each of the subcells has an effective bandgap energy. The subcells are disposed in order of increasing effective bangap energy, with the subcell having the lowest effective bandgap energy being closest to the substrate. In certain cases, each subcell is designed to absorb a substantially same amount of solar photons.

22 Claims, 7 Drawing Sheets

U.S. PATENT DOCUMENTS

| | | | |
|---|---|---|---|
| 5,851,310 | A | 12/1998 | Freundlich et al. |
| 6,166,320 | A | 12/2000 | Nagashima et al. |
| 6,239,449 | B1 | 5/2001 | Fafard |
| 6,252,287 | B1 | 6/2001 | Kurtz et al. |
| 6,340,788 | B1 * | 1/2002 | King et al. ............... 136/261 |
| 6,372,980 | B1 * | 4/2002 | Freundlich ............... 136/255 |
| 6,444,897 | B1 * | 9/2002 | Luque-Lopez et al. ...... 136/255 |
| 6,559,480 | B1 | 5/2003 | Inuzuka et al. |
| 6,566,595 | B2 | 5/2003 | Suzuki |
| 6,583,436 | B2 | 6/2003 | Petroff et al. |
| 6,951,819 | B2 * | 10/2005 | Iles et al. ............... 438/705 |
| 2002/0050288 | A1 * | 5/2002 | Suzuki ............... 136/255 |

FOREIGN PATENT DOCUMENTS

| | | |
|---|---|---|
| EP | 0984484 A1 | 3/2000 |
| EP | 1130657 | 9/2001 |
| EP | 1333509 | 8/2003 |
| WO | WO 02/058200 | 7/2002 |

OTHER PUBLICATIONS

S. Fafard, et al., "Lasing in Quantum Dot Ensembles with Sharp Adjustable Electronic Shells", *Appl. Phys. Lett. 75*, (1999), pp. 986-988.

P.G. Piva et al, "Enhanced Degradation Resistance of Quantum Dot Lasers to Radiation Damage", *Appl. Phys. Lett. 77*, (2000) pp. 624-626.

Chinese Office Action from Chinese Application No. 20050002861.2 dated May 9, 2008.

Australian Patent Application No. 2005205373 Search Report dated Dec. 10, 2008.

European Patent Application No. 05 70 0284: Supplementary European Search Report dated Feb. 4, 2009.

* cited by examiner

SOLAR CELL WITH EPITAXIALLY GROWN QUANTUM DOT MATERIAL

CROSS REFERENCE TO RELATED APPLICATIONS

This application claims the benefit of U.S. Provisional Application No. 60/537,259, filed Jan. 20, 2004, which is incorporated herein by reference.

FIELD OF THE INVENTION

The present invention relates generally to photovoltaic solar cells. More particularly, the invention relates to III-V multijunction semiconductor solar cells having an epitaxially grown quantum dot material.

BACKGROUND OF THE INVENTION

The sun emits a wide optical spectrum that peaks in the visible and has 60% of its photon flux in the wavelength range spanning from ~350 nm to ~1350 nm. This wavelength range corresponds to 80% of the sun's total power flux of ~1.3 kW/M² at the earth.

It has been known for decades that the best approach to convert the sun's optical power into electrical power is through solar cells that make use of absorption transitions in semiconductors. Photon energy is harnessed in this way by exciting electrons from the semiconductor's valence band across the bandgap into the conduction band. The photocarriers thus generated, i.e. the electrons and holes, are then swept across a p-n or p-i-n junction fabricated by doping different regions of the semiconductor structure, and are used to produce electricity. Semiconductors or semiconductor alloys with bandgaps $E_g$ absorb impinging photons having energies greater than or equal to $E_g$ as opposed to photons having energies less than $E_g$. Equivalently, it can be said that photons having wavelengths corresponding to energies greater than $E_g$ are absorbed while photons having longer wavelengths are not.

Since the energy of a photon in excess of $E_g$ is effectively lost through thermal processes, it is well established that a combination of materials having different bandgaps must be used to adjust the voltage and current of the solar cell in order to optimize the conversion efficiency of solar light into electricity. To that effect, multijunction solar cells, also known as tandem solar cells, have been developed for applications requiring higher conversion efficiencies.

From a fabrication and crystal perspective, the choice of semiconductors or semiconductor alloys is practically restricted to materials that can be grown on common substrates, such as GaAs, Ge, Si, or InP substrates, with a minimum of defects. To date, the best optical to electrical conversion efficiencies, the conversion efficiency being defined as the electrical power that the device can produce divided by the optical power received from a light source such as, for example, the sun, are around 30% and have been achieved by growing a monolithic multijunction cell having a GaInP top subcell ($E_g$~1.8 eV), a GaAs middle subcell ($E_g$~1.4 eV), and a Ge bottom subcell ($E_g$~0.7 eV) on a Ge substrate. Since the subcells are typically connected in series through tunnel junctions, it is recognized that to improve further the conversion efficiency, the bandgaps of the materials have to be changed or, a fourth subcell added.

The total voltage of the multijunction cell is essentially the sum of the voltages generated by the individual subcells, where the voltage of each subcell is proportional to the subcell's bandgap. To optimize the conversion efficiency, the subcells should be current-matched, otherwise the subcell generating the weakest current limits the overall current. In the case above, GaInP has a bandgap that can absorb 25% of the total solar photon flux (sometimes referred to as the AM0 spectrum), whereas only 14% of the total solar photon flux transmitted through the GaInP subcell can be absorbed by the GaAs subcell, and 38% of the total solar photon flux transmitted through the GaAs subcell can be absorbed by the Ge subcell.

This clearly leads to a current imbalance in the multijunction cell. Relatively speaking, the GaAs subcell does not absorb enough solar photons while the Ge subcell captures too many. To equilibrate the current balance between the subcells, the middle subcell, i.e. the subcell disposed between the GaInP and the Ge subcells, would have a smaller bandgap. For example, a middle subcell having a bandgap of ~1.16 eV (corresponding to an optical wavelength of approximately 1100 nm) would imply that all the three subcells would each absorb approximately 25% of the total solar photon flux. The remaining 25% of the solar photon flux would not be absorbed since the three subcells are transparent to the longer wavelength photons (i.e. photons with wavelengths greater than 1.8 μm are not absorbed).

As mentioned above a four-subcell arrangement can improve the current balance. If a material with Eg~1.0 eV is introduced between the GaAs and the Ge subcells, it yields the following distribution in the absorption of the solar photon flux: ~25% of the photons absorbed by the first subcell (GaInP), ~14% by second subcell (GaAs), ~19% by the third subcell (Eg ~1 eV), and ~19% by the fourth subcell (Ge). However, this four-subcell arrangement is still current-limited by the GaAs subcell. To make the four-subcell arrangement better balanced in terms of current, the thickness of the first subcell can be adjusted (reduced) to let some of the shorter wavelength photons reach the second subcell. In this scenario, the second subcell absorbs more photons having energies greater than that of its bandgap thus leading to more thermally wasted energy. This was described by Olson et al. in U.S. Pat. No. 5,223,043 incorporated herein by reference.

Research and development to find new materials and novel multijunction arrangements to improve the efficiency of solar cells has been very active. For example, Olson, in U.S. Pat. No. 4,667,059, disclosed dual GaInP/GaAs cells on a GaAs substrate; Ho et al., in U.S. Pat. No. 5,405,453, disclosed dual GaInP/GaAs cells on a Ge substrate; Wanlass, in U.S. Pat. No. 5,019,177, disclosed dual InP/GaInAsP cells on InP; Freundlich et al., in U.S. Pat. No. 5,407,491, disclosed dual InP/InGaAs cells on an InP substrate; Chang et al., in U.S. Pat. No. 5,330,585, disclosed the dual AlGaAs/GaAs cells on a GaAs substrate; these patents being incorporated herein by reference.

These examples of dual cells and the triple cell made of GaInP/GaAs/Ge on a Ge substrate can have conversion efficiencies close to 30% as long as compromises in the design or in the quality of the materials are made. The compromise in the case of the dual cells having GaAs as the smallest bandgap is that the longer wavelength photons are not absorbed, they are transmitted though all the layers. In the case of dual cells with the smaller InGaAs or InGaAsP bandgaps, the compromise is that the shorter wavelength photons are losing their excess energies in heat. It is also worth nothing that GaAs or Ge substrates have the advantage of a lower cost compared to InP substrates.

To extend the photo-absorption of GaInP/GaAs cells to longer wavelengths, Freundlich, in U.S. Pat. No. 6,372,980, incorporated herein by reference, disclosed solar cells with InGaAs quantum wells, the solar cells having modeled efficiencies in excess of 30%. Other schemes have also been disclosed to try to improve the efficiency of solar cells. For example, Freundlich et al., U.S. Pat. No. 5,851,310, incorporated herein by reference, disclosed the use of strained quantum wells grown on an InP substrate. Also, Suzuki in U.S. Pat. No. 6,566,595 (later referred to as '595), incorporated herein by reference, disclosed the use of quantum well layers having a plurality of projections with different sizes, the goal being of better matching the sun's spectrum by using materials having different bandgaps.

Similar is the disclosure by Sabnis et al. in U.S. Pat. No. 4,206,002, incorporated herein by reference, for bulk graded bandgap multijunction solar cells. In the case of the '595 patent however, the overall efficiency is unlikely to be improved since the tailoring of the absorption spectrum involves distributing quantum well or quantum dot materials of different sizes in the plane of the layers. This compromises the spatial density of the material that can be used to absorb light and is likely to require thicker layers to absorb the same number of photons as would be absorbed in uniform layers or, larger surfaces which would reduce the conversion efficiency. Chaffin et al., in U.S. Pat. No. 4,688,068, incorporated herein by reference, also disclosed the use of quantum wells in multijunction cells.

As disclosed by Kurtz et al. in U.S. Pat. No. 6,252,287, incorporated herein by reference, InGaAsN lattice-matched to GaAs is also a promising material for tailoring the bandgap of layers lattice-matched to GaAs for optimizing the conversion efficiency.

Other aspects of the fabrication of monolithic multijunction solar cells such as antireflection windows, tunnel junctions, and surface metallization have matured with the extensive developments of photovoltaic solar cells as disclosed in numerous patents and publication in that field as seen in several of the patents identified above (for example, U.S. Pat. Nos. 4,694,115; 5,009,719; 4,419,530; 4,575,577).

In the field of semiconductor nanostructures, it is well known that high-quality, defect-free, self-assembled quantum dots can be obtained during the early stage of growth of highly strained semiconductors (see for example: S. Fafard, et al., "Manipulating the Energy Levels of Semiconductor Quantum Dots", *Phys. Rev. B* 59, 15368 (1999) and S. Fafard, et al., "Lasing in Quantum Dot Ensembles with Sharp Adjustable Electronic Shells". *Appl. Phys. Lett.* 75, 986 (1999)). Such quantum dot material can be grown in multiple layers to achieve thick active regions for devices such as Quantum Dot Infrared Photodetectors, as disclosed by Fafard et al. in U.S. Pat. No. 6,239,449, incorporated herein by reference. There, the interband absorption properties of the quantum dot material can be tailored to cover various wavelength ranges in the near infrared and visible portions of the optical spectrum. The composition, size and shape of the quantum dot material are adapted to change the quantization energies and the effective bandgap of the quantum dot material, where the effective bandgap of the material is defined as essentially being the lowest energy transitions at which photons can be absorbed and is determined by the quantized energy levels of the heterostructure.

Self-assembled quantum dots come in a wide range of high quality materials that can be pseudomorphically grown on GaAs or InP. For example, InAlAs/AlGaAs on GaAs substrates absorbs in the red or the near-infrared, InAs/InAlAs on InP substrates absorbs in the 1.5 μm wavelength range, and InAs/InGaAs on InP substrates absorbs in the 1.9 μm wavelength range. More importantly however, In(Ga)As/GaAs self-assembled quantum dot material grown on GaAs substrates, is particularly well-suited for absorption below the GaAs bandgap in the spectral region spanning from 885 nm to 1150 nm, or up to ~1350 nm depending on the growth parameters. In(Ga)As/GaAs self-assembled quantum dot layers can be grown uniformly and with high densities. Furthermore, multiple layers can be grown with the same uniformity or, when desirable, with different sizes and/or compositions by simply controlling the growth parameters. Additionally, the In(Ga)As/GaAs self-assembled quantum dot material has been shown to produce devices which are orders of magnitude more radiation robust than conventional material (see for example: P. G. Piva et al., "Enhanced Degradation Resistance of Quantum Dot Lasers to Radiation Damage". *Appl. Phys. Left.* 77, 624 (2000)). The radiation and defect hardnesses are particularly great advantages for space applications where the solar cells are getting exposed to radiations.

As can be appreciated from the prior art discussed above, there is a real need for high quality materials having desired absorption spectra, that can be easily incorporated in multijunction solar cells to improve further the conversion efficiency. A reliable material that can balance the absorption between the bandgaps of GaAs and Ge is of particular interest.

SUMMARY OF THE INVENTION

In a first aspect, the present invention provides a monolithic, multijunction, semiconductor photovoltaic solar cell comprising a plurality of subcells disposed in series, the plurality of subcells having at least one subcell including an epitaxially-grown self-assembled quantum dot material.

In a further embodiment, there is provided a monolithic semiconductor photovoltaic solar cell comprising: a Si substrate; a transition layer metamorphically grown on the Si substrate, the transition layer including a plurality of GaAs and AlGaAs layers; and a first subcell epitaxially grown on the transition layer, the first subcell including a self-assembled quantum dot material.

In further aspect, the present invention provides a monolithic semiconductor photovoltaic solar cell comprising: an InP substrate; a first subcell epitaxially grown on the substrate, the first subcell including a plurality InAs quantum dot layers intercalated with InGaAs layers.

In a further aspect, the present invention provides a method of fabricating a monolithic, multifunction, photovoltaic solar cell on a substrate, the method comprising the step of: forming a quantum dot subcell by epitaxially growing a self-assembled quantum dot material having a plurality of quantum dot layers intercalated with barriers.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of examples only, with reference to the attached Figures, wherein.

DETAILED DESCRIPTION

The present invention provides monolithic semiconductor photovoltaic solar cells comprising at least one subcell having a self-assembled quantum dot material. Also provided is a method for making such solar cells, the method using epitaxial growth of self-assembled quantum dot material in at least one subcell of the solar cell.

The first embodiment is a high efficiency monolithic three-junction photovoltaic solar cell. Three-junction photovoltaic solar cells can be fabricated by stacking p-n or n-p junctions made of different semiconductor materials. As stated above, conversion efficiencies of approximately 30% have been obtained using a Ge bottom subcell grown on a Ge substrate, with a GaAs middle subcell and a GaInP or AlGaAs top subcell. The efficiency of such a multijunction photovoltaic solar cell is improved in the present invention by using self-assembled quantum dot material in the middle subcell instead of bulk GaAs.

Figure 1:
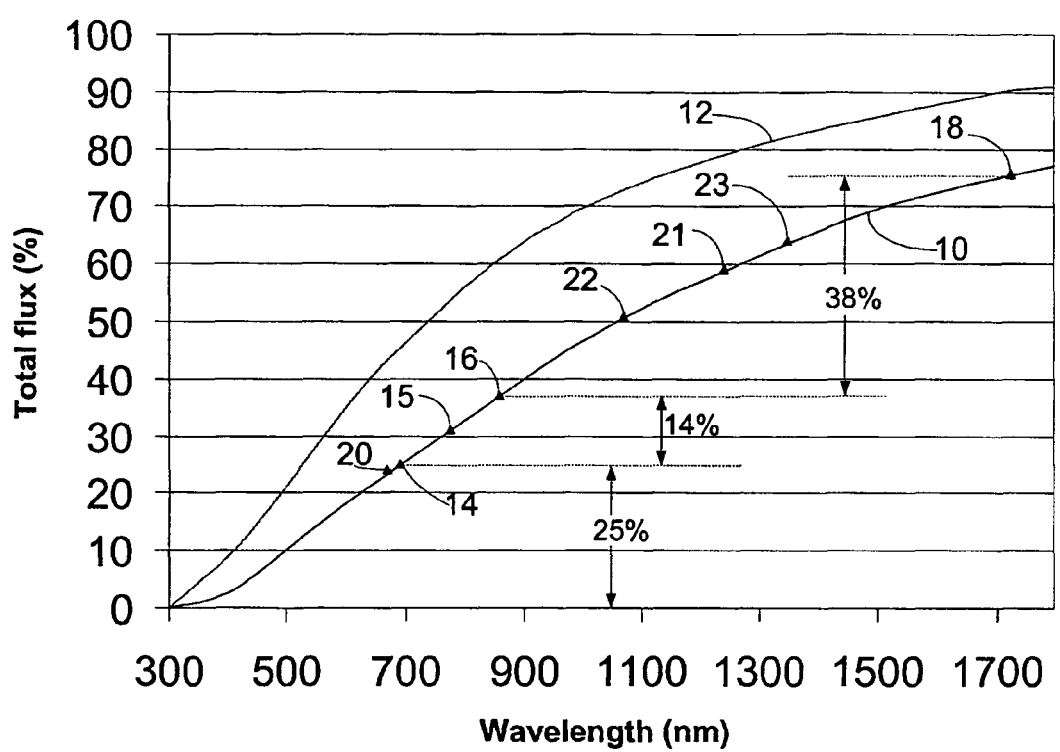
FIG. 1 shows the percentage of the AM0 solar photon and power fluxes integrated from 200 nm.

The principle of the invention is illustrated in FIG. 1 where plot 10 shows the percentage of the AM0 solar photon flux, integrated from the 200 nm wavelength, as a function of wavelength, and plot 12 shows the percentage of the AM0 solar power flux integrated from 200 nm wavelength as a function of wavelength. Reference numerals on plot 10 indicate semiconductor materials and their absorption edges. These semiconductor materials can be used in converting photons (solar or otherwise) to electrical carriers. The plotted points of FIG. 1 are referred to in the description as cells, subcells, particular semiconductor material or absorption edges, depending on their particular context.

To optimize the conversion efficiency of a solar cell, the current of each subcell must be substantially equal since the subcells are connected in series. Neglecting the reflection at the surface of the device, which is a valid approximation for solar cells equipped with an antireflection coating, the light intensity transmitted at a depth z from the surface of the semiconductor is given by $I(Z)=I_o\exp(-\alpha Z)$. $I_o$ is the input intensity and $\alpha$ is the semiconductor absorption coefficient, which is a function of the wavelength dependent density of states of the material (i.e. a is wavelength dependent). For sufficiently thick semiconductor material, only light having a wavelength longer than the semiconductor bandgap equivalent wavelength (or with an energy less than the bandgap energy) will transmit through the semiconductor layer since the density of states drops, as does $\alpha$, for photon energies less than the bandgap energy. For direct bandgap semiconductors, at wavelengths shorter than the bandgap wavelength, $\alpha$ is in the $10^4 cm^{-1}$ to $10^5 cm^{-1}$ range and each impinging photon can create a pair of photocarriers, i.e. an electron and a hole.

The current in a subcell is proportional to the fraction of photon flux absorbed by the subcell. As can be inferred from plot 10, a GaInP/GaAs/Ge solar cell absorbs about 25% of the photon flux in its top GaInP subcell 14, approximately 14% in its middle GaAs subcell 16, and approximately 38% in the bottom Ge subcell 18. Replacing the top GaInP subcell 14 with an AlGaAs subcell 20 would yield similar results.

The imbalance in the absorption of the solar photon flux by subcells 14, 16 and 18 leads to a current imbalance. That is, the Ge bottom subcell 18 is generating the most current and the middle GaAs subcell 16 is limiting the overall current and conversion efficiency. The overall conversion efficiency can be improved by substituting GaAs material 16 with a material having an effective bandgap wavelength of about 1070 nm (1.16 eV). As will be seen in detail below, such a material can be a self-assembled quantum dot material 22. By using quantum dot material 22 in the middle subcell, the solar photon flux absorption of each of the three subcells is about 25% of the total solar photon flux and the current generated by each subcell will be equal. The theoretical efficiency can be calculated to give the thermodynamic limit of photovoltaic energy conversion. The theoretical efficiency takes into account the bandgap of the subcell, the impinging photon flux and its spectral distribution to estimate the corresponding open-circuit voltage ($V_{oc}$) and the short-circuit current ($J_{sc}$) as described by, for example, Baur et al in paper 3P-B5-07 of the WCPEC-3 Proceedings Osaka, 2003. For an optimized configuration, the conversion efficiency could theoretically exceed 40%.

Figure 2:
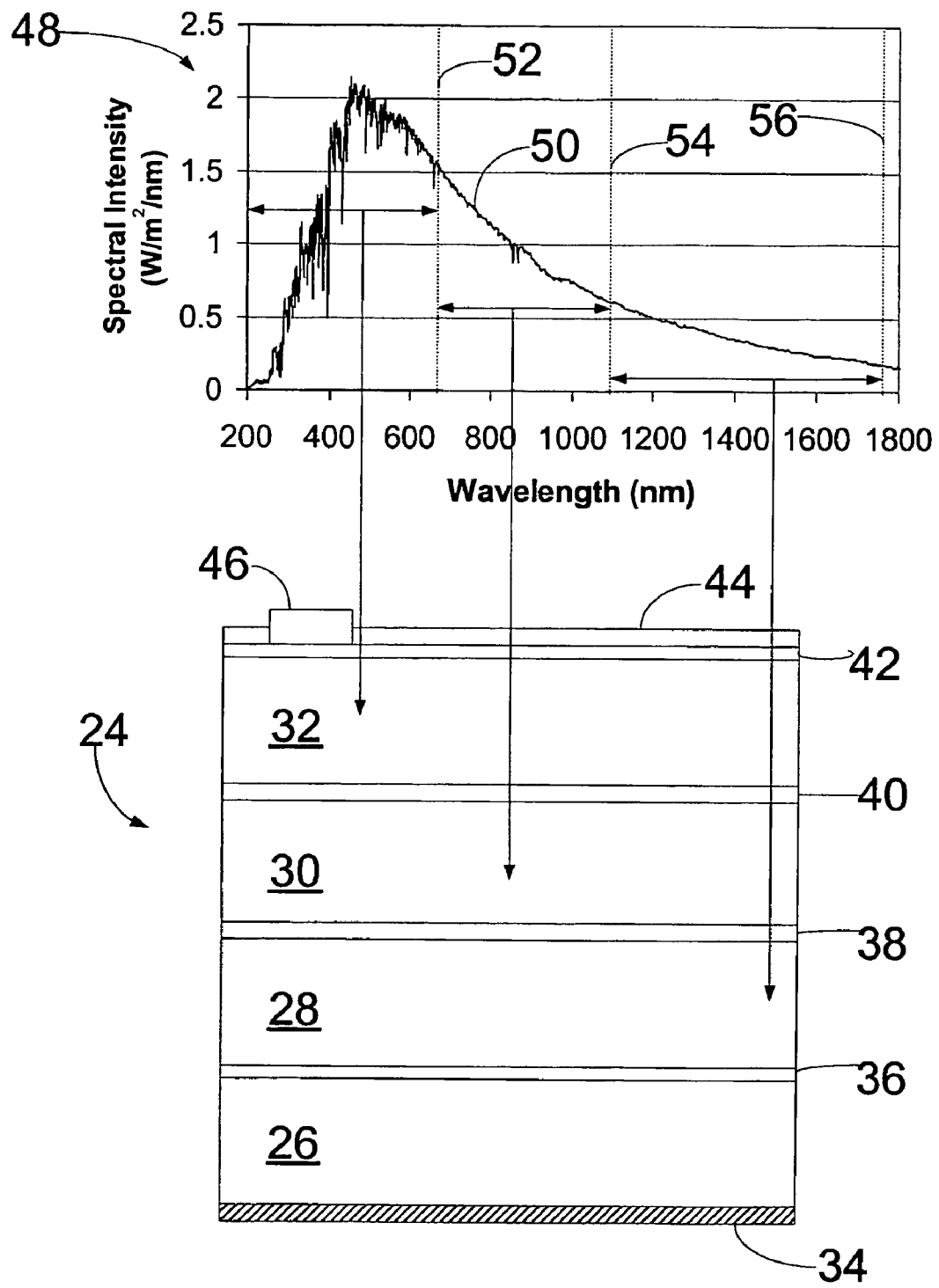
FIG. 2 depicts a monolithic three-subcell photovoltaic solar cell of the present invention.

The details of such a monolithic three-junction photovoltaic solar cell is illustrated is FIG. 2 (not to scale), which sketches an embodiment for the solar cell of the present invention. The multijunction solar cell 24 comprises a substrate 26, first subcell 28, second subcell 30 pseudomorphically grown by epitaxy and comprising self-assembled In(Ga)As/GaAs quantum dot material, and third subcell 32. The In(Ga)As/GaAs quantum dot material of second subcell 30 can be tailored to obtain an effective bandgap of about 1.16 eV. Other techniques can be used to produce similar nanostructures using other epitaxial techniques such as selective area epitaxy, templated epitaxy, epitaxy with stained-induced bandgap modified heterostructures, Volmer-Weber growth modes, modified Stranski-Krastanow growth modes, Frank-Van der Merwe growth modes combined or not with high-resolution microfabrication, or, non-epitaxial techniques involving, for example, colloidal quantum dots; however, the optical and/or structural properties of such nanostructures are typically not suited for improving the efficiency of multijunction solar cell devices.

According to this embodiment of the invention, substrate 26 can be conductive GaAs or preferably conductive Ge, both of them having a similar lattice constant. The doping of substrate 26 can be n-type or p-type. Whether substrate 26 is n-type with an n-p or an n-i-p junction grown on top or, p-type with a p-n or a p-i-n junction grown on top, is not fundamental to the present invention. For illustration purposes, this embodiment will use an n-type substrate with n-p or n-i-p junction. Other possible combinations, which could include an undoped substrate and buried back contacts, are equally possible. Substrate 26 may be metallized to form ohmic contact 34 on the backside, as illustrated in FIG. 2, and a buffer and/or back field layers 36 can be grown between substrate 26 and first subcell 28 to optimize various structural, electrical, or optical properties. First subcell 28 is preferably made of Ge and includes an n-p junction to create a depletion region. A tunnel junction 38 is used to connect first subcell 28 with second subcell 30.

As will be readily understood by a person skilled in the art, tunnel junction 38 is preferably made of a high quality material that can be epitaxially grown on first subcell 28. Tunnel junction 38 is preferably highly doped to provide good electrical conduction and to support high current densities and, is preferably transparent to photons traversing it. For this embodiment tunnel junction 38 can be made of a highly doped GaAs n-p junction but many other combinations supporting the requirements herein are equally valid.

Second subcell 30 comprises a self-assembled In(Ga)As/GaAs quantum dot material, adapted to, or tailored to, obtain an effective bandgap of about 1.16 eV. More details about second subcell 30 are given in FIG. 4 and its corresponding description where it is disclosed to contain an n-p or an n-i-p junction comprising a plurality of layers with high-quality self-assembled In(Ga)As/GaAs quantum dots of a specific shape, composition, and density, grown pseudomorphically by epitaxy.

Second subcell 30 is electrically connected to third subcell 32 via tunnel junction 40. The requirements of tunnel junction 40 are similar to those of tunnel junction 38 discussed above. In this embodiment tunnel junction 40 can be made of a highly doped InGaP or AlGaAs n-p junction but many other combinations are equally valid. Third subcell 32 is essentially an n-p junction preferably made of doped GaInP or doped AlGaAs, or a similar alloy latticed-matched to GaAs, with a bandgap around 1.8 eV. Third subcell 32 may include window 42, antireflection layer 44, and contact 46 as is customary in multijunction solar cells.

The top part of FIG. 2 shows graph 48 of spectral intensity as a function of wavelength for solar spectrum 50. FIG. 2 also illustrates absorption ranges 52, 54 and 56 of solar spectrum 50 for third subcell 32, second subcell 30 and first subcell 28 respectively. In view of the discussion relating to FIG. 1, it will be clear for someone skilled in the art that such a three-junction photovoltaic solar cell has good current matching between the subcells together with high conversion efficiencies.

Figure 3:
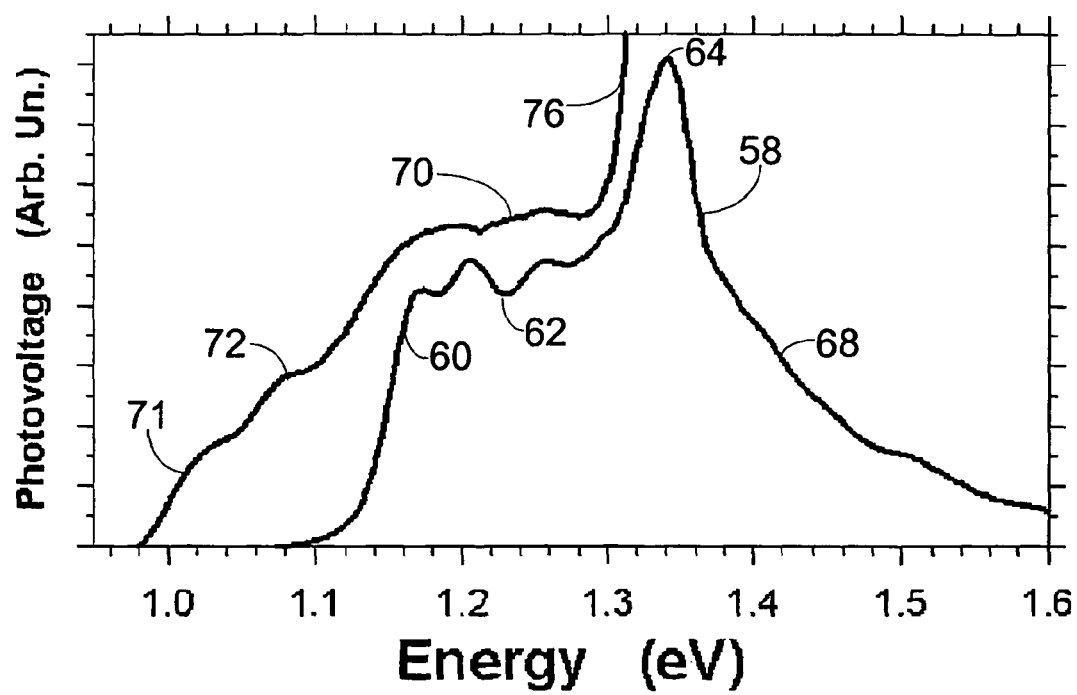
FIG. 3 shows photovoltaic spectra of self-assembled quantum dot materials.

FIG. 3 shows photovoltaic spectrum 58 of high quality self-assembled quantum dot materials, i.e. materials that may be comprised within second subcell 30, grown within a p-i-n junction. Plot 58 shows the spectrum of a first material measured at 20° C. The features of plot 58 are quantum dot material ground states 60, quantum dot material excited states 62 and wetting layer states 64, a wetting layer being a thin continuous layer that usually forms during the epitaxy of the self-assembled quantum dots. In this self-assembling epitaxial process, the first monolayer, or first few monolayers, are deposited in uniform two-dimensional layers called the wetting layers. Quantum dots then self-assemble from the additional material deposited and/or in part from the previous wetting layer material. Plot 58 was measured using a white light source transmitted through GaAs layers. Signal decrease 68 is observed for energies greater than the GaAs bandgap. Quantum dot ground states 60 can be referred to as the effective bandgap of a self-assembled quantum dot material. For bulk semiconductors not comprising semiconductor heterostructures, the effective bandgap is simply the bandgap of the semiconductor material.

It is known that quantum dots energy levels can be adjusted by controlling their shape, composition, and density during growth [for example see: S. Fafard, et al., "Manipulating the Energy Levels of Semiconductor Quantum Dots", Phys. Rev. B 59, 15368 (1999) or S. Fafard, et al., "Lasing in Quantum Dot Ensembles with Sharp Adjustable Electronic Shells", Appl. Phys. Left. 75, 986 (1999).]. For plot 58, the self-assembled In(Ga)As/GaAs quantum dot material was tailored to have an effective bandgap of about 1.16 eV. The material measured in plot 58 contains 14 layers of In(Ga)As quantum dots separated with 10 nm barriers made of GaAs.

Figure 4:
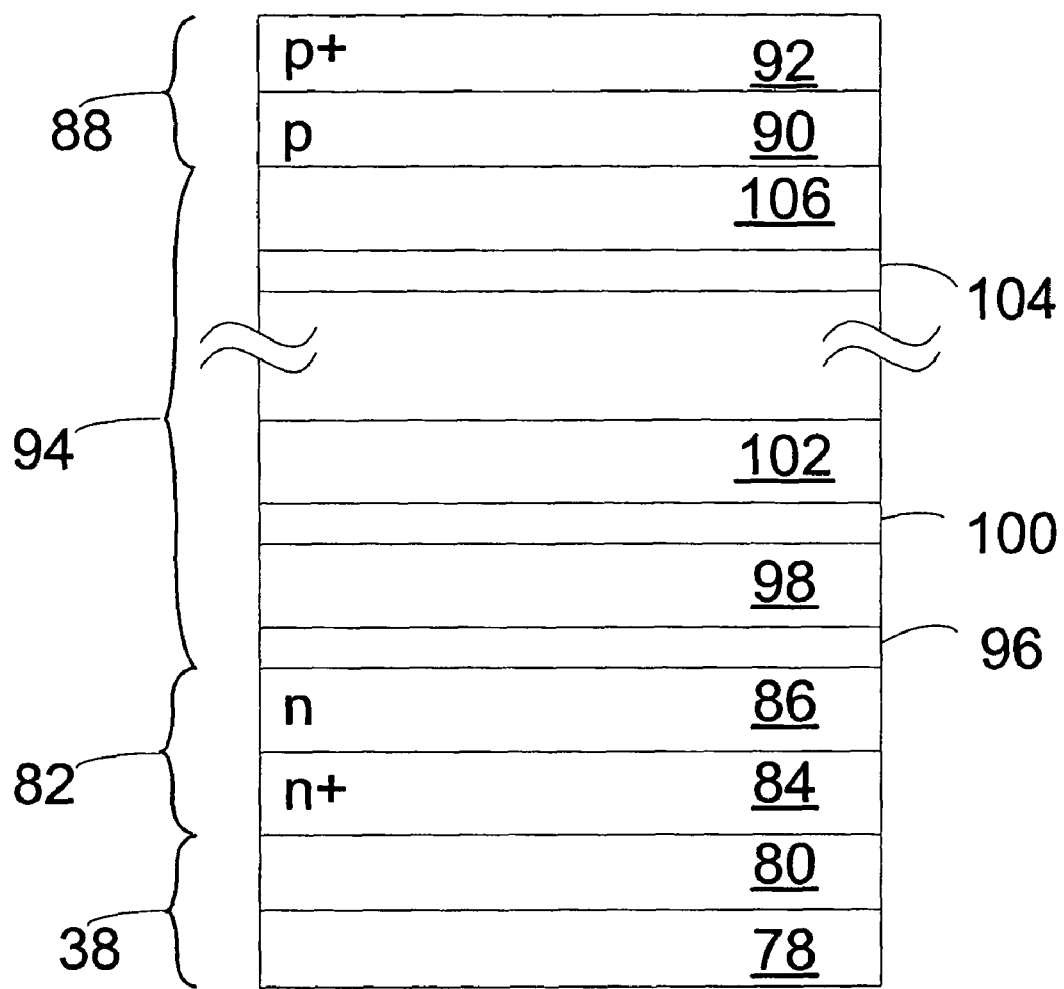
FIG. 4 depicts a self-assembled quantum dot material of the present invention.

An embodiment of second cell 30 is shown in FIG. 4. There, a plurality of III-V semiconductor alloy layers is grown epitaxially on tunnel junction 38, which comprises heavily p-doped layer 78 and heavily n-doped layer 80. An emitter 82 is formed by the combination of highly n-doped layer 84 and n-doped layer 86. Emitter 82 is preferably made of GaAs or from another alloy lattice-matched to GaAs and has a bandgap close to the bandgap of GaAs. Similarly, a collector 88 is later grown using p-type doping for layer 90 and highly p-doped layer 92. Silicon is preferably used for n-type doping while beryllium is preferably used for p-type doping. Obviously, other dopants may be used such as, for example, Zinc (Zn), Tellurium (Te), or others.

Emitter 82 and collector 88 form an n-i-p junction together with intrinsically undoped self-assembled quantum dot material 94 disposed between emitter 82 and collector 88. The doping profiles of emitter 82 and collector 88 are such that they provide a depletion region extending substantially across self-assembled quantum dot material 94. Similar configurations can be designed using an n-p junction instead of an n-i-p one, or by reversing the order of the p and n doping. Additionally, since self-assembled quantum dot material 94 is pseudomorphically grown on GaAs, Bragg reflectors or distributed Bragg reflector (DBR) cavities comprising alternate layers of high and low index of refraction semiconductors may be grown within the emitter and/or the collector, to enhance the reflectivity and change the absorption properties of the subcell and consequently of solar cell 24. Similar self-assembled quantum dot material 94, together with emitter 82 and collector 88, as depicted in FIG. 4, will be used in the description of all embodiments of the present invention.

Self-assembled quantum dot material 94 comprises a first quantum dot layer 96, first barrier 98, second quantum dot layer 100, second barrier 102 and so on up to $N^{th}$ self-assembled quantum dot material 104 and $N^{th}$ barrier 106. It will be clear for one skilled in the art that the N quantum dot layers need not be identical in thickness or composition. Furthermore, layers can be inserted in self-assembled quantum dot material 94 to optimize optical, structural or electrical properties of solar subcells such as second subcell 30. For example layers with other bandgaps or with a another lattice constant can be grown above and/or below quantum dot layers 96, 100, 104 to modify the optical and/or the structural properties of quantum dot material 94. Also, layers with other bandgaps or with another lattice constant can be grown within barriers 98, 102, 106. The growth of such intermediate layers within the barriers is particularly important to control the total strain built in the structure. For example, the thickness of semiconductor layers having a lattice constant smaller than the epitaxial layer and smaller than the lattice constant of the substrate can be chosen to yield layers that would compensate the strain introduce when using a semiconductor with a larger lattice constant for the quantum dot layers. For example, GaPAs or GaInP can be grown within the barriers to compensate the strain of the InAs or InGaAs quantum dots. Furthermore, the plurality of layers could contain a number of sub-groups of layers having similar properties, such that N layers would be composed of m sub-groups each containing a number $m_i$ of quantum dot and barriers layers having a similar size, composition, and effective bandgap.

In the present embodiment, growth materials and parameters can be chosen to obtain self-assembled quantum dot material 94 with desired absorption characteristics such as, for example, an absorption edge at 1.16 eV. Pseudomorphic growth of the self-assembled quantum dot material 94 is obtained by epitaxy using, for example, a molecular beam epitaxy (MBE) system. The MBE system is used for growing, for example, GaAs or AlGaAs layers on a semiconductor material lattice-matched to GaAs. Epitaxy systems other than MBE systems can be used. They may include, for example, chemical beam epitaxy (CBE), metal organic chemical vapor deposition (MOCVD) or other similar hybrid systems or combination thereof. To obtain the desired optical, electrical and structural properties, the growth temperature is maintained in a range that optimizes the desired properties while avoiding high temperatures that could cause intermixing of layers or diffusion of dopants present, for example, in emitter 82 or collector 88 layers.

As an example, when intermixing or diffusion of the dopants in emitter 82 layers is not a concern, the growth of the GaAs layers is preferably done in a temperature range comprised between 400° C. and 800° C., preferably between 520° C. and 630° C. and most preferably between 600° C. and 630° C. In the case where intermixing and/or diffusion of dopants is a concern during the epitaxial growth of the quantum dot layers, the growth temperature is preferably comprised between of 450° C. and 550° C. and most preferably between of 490° C. and 530° C. The growth temperature of the quantum dot layers is used to adjust the shape and composition of the quantum dots. The temperature during the overgrowth of the barrier of each quantum dot layer may be varied at different stages of the overgrowth to further control the size and composition of the quantum dots and therefore the absorption characteristics of self-assembled quantum dot material 94.

The combination of growth temperature, the group V overpressure or the III/V ratio, the quantum dot material, the amount of material used to obtain the self-assembled growth transition between a uniform quasi two-dimensional film to three-dimensional islands, the growth rate or the pauses used during the growth, and the overgrowth conditions such as growth temperature and growth rate, are chosen to obtain quantum dot layers having a high in-plane density of highly uniform quantum dots having desired energy levels. This allows high conversion efficiencies of impinging solar photons into electricity.

As will be apparent to one skilled in the art, there are many combinations of parameters that can accomplish the desired absorption characteristics. However, for illustration purposes of the present embodiment, the desired absorption of the self-assembled quantum dot material 94 can be obtained by growing InAs on GaAs, the thickness of InAs being comprised between 0.6 nm and 0.8 nm and preferably comprised between 0.68 nm and 0.72 nm. The preferred growth rate of InAs is comprised between 0.001 and 3 nm/s and most preferably between 0.01 and 0.03 nm/s, with a growth pause following the InAs deposition, the growth pause preferably ranging from 0 to 300 seconds. The growth of the InAs quantum dot layer is followed with the over-growth of a barrier layer having a thickness ranging from 6 nm to 50 nm, the barrier layer preferably being GaAs or $Al_xGa_{1-x}As$, x being comprised between 0 and 1 but preferably comprised between 0 and 0.35. The growth sequence of quantum dot layer and barrier layers is repeated a number of times as stated above.

As mentioned above, a specific temperature cycling of the substrate may be used to adjust the shape, composition, and uniformity of the quantum dots during the overgrowth of the quantum dot layers and barrier layers. In this case, the temperature of substrate 26 is increased preferably above the InAs disorption temperature which is roughly 530° C. for MBE growth and can depend, amongst different factors, on the growth method and on the use of a surfactant. Once the temperature has been increased above the InAs disorption temperature, it is decreased back to a nominal value preferably comprised between 450° C. and 550° C. and most preferably between 490° C. and 530° C. This is followed by the growth of a subsequent quantum dot layer. In the case where the desired absorption edge is 1.16 eV, the temperature cycling performed during the over-growth may occur when the thickness of the barrier is comprised between 1 nm and 50 nm, preferably between 2.0 nm and 10.0 nm, and most preferably between 4.5 nm and 6.5 nm.

In the preferred embodiment, the number of quantum dot layers is comprised between 1 and 100 preferably between 30 and 80. It is possible to grow more layers if necessary. The larger the number of layers of self-assembled quantum dot layer material 94, the larger the absorption coefficient of second cell 30 will be, which is desirable to increase the current of second cell 30.

The distance between the quantum dot layers, i.e. the barrier thickness, is adjusted to (A) change the desired characteristics of the absorption spectrum; (B) control the vertical stacking of the self-assembled quantum dots; and (C) maintain the overall strain level below that related to the critical thickness that leads to the onset of lattice relaxation. For thicknesses above the critical thickness, the quantum dot material could start developing material dislocations and defects. The critical thickness can be measured and/or estimated by using, for example, Matthew's law. For the average InGaAs composition of interest with low indium content the critical thickness is expected to be between 1 and 2 microns. The critical thickness is smaller for higher average indium content. The distance between the quantum dot layers can therefore be used to adjust the average indium composition of the quantum dot material and avoid dislocations and defects caused by strain and lattice relaxation. As discussed above, the quantum dot layers typically have a larger lattice constant than the rest of the structure and therefore the embodiment can also incorporate thin layers of semiconductors such as GaPAs or InGaP with the opposite strain (i.e. smaller lattice constant) for the purpose of reducing the average strain in the quantum dot material if necessary. For example, as mentioned above, layers with a different lattice constant can be grown above and/or below the quantum dot layers 96, 100, 104 to modify the structural properties of the quantum dot material 94, or similarly layers with a different lattice constant can be grown within the barriers 98, 102, 106.

A second embodiment of the invention provides high efficiency monolithic four-junction photovoltaic solar cells. Self-assembled quantum dot material 94 may be adapted to absorb photons with energies greater than about 1.0 eV, indicated as material 21 in FIG. 1. Such a material can be used to fabricate a high-efficiency monolithic four-junction photovoltaic solar cell depicted in FIG. 5 where the subcells will be current-matched if each of the subcells absorbs about 19% of the solar flux.

The four-junction solar cell comprises substrate 108 upon which first subcell 110 is fabricated. First subcell 110 preferably includes germanium with an appropriate doping profile, the germanium being grown on substrate 108 by epitaxy or by other crystal growth methods. Alternatively, first subcell 110 can be fabricated by intermixing or implanting dopants in bulk germanium material such as, for example, a Ge substrate to create the appropriate doping profile. For example, when III-V semiconductor materials are grown on p-type Ge, the intermixing of the group V within the Ge of the substrate will form an n-type Ge region and therefore a p-n junction. Similarly for an n-type Ge substrate, the intermixing of the group III within the Ge of the substrate would form a p-type region and therefore an n-p junction. Second subcell 112 is pseudomorphically grown on first subcell 110 by epitaxy and comprises a self-assembled In(Ga)As/GaAs quantum dot material adapted to obtain an effective bandgap of about 1.0 eV. Third subcell 114 is pseudomorphically grown on second subcell 112 by epitaxy and is followed by fourth subcell 116, which is pseudomorphically grown on third subcell 114 by epitaxy.

Figure 5:
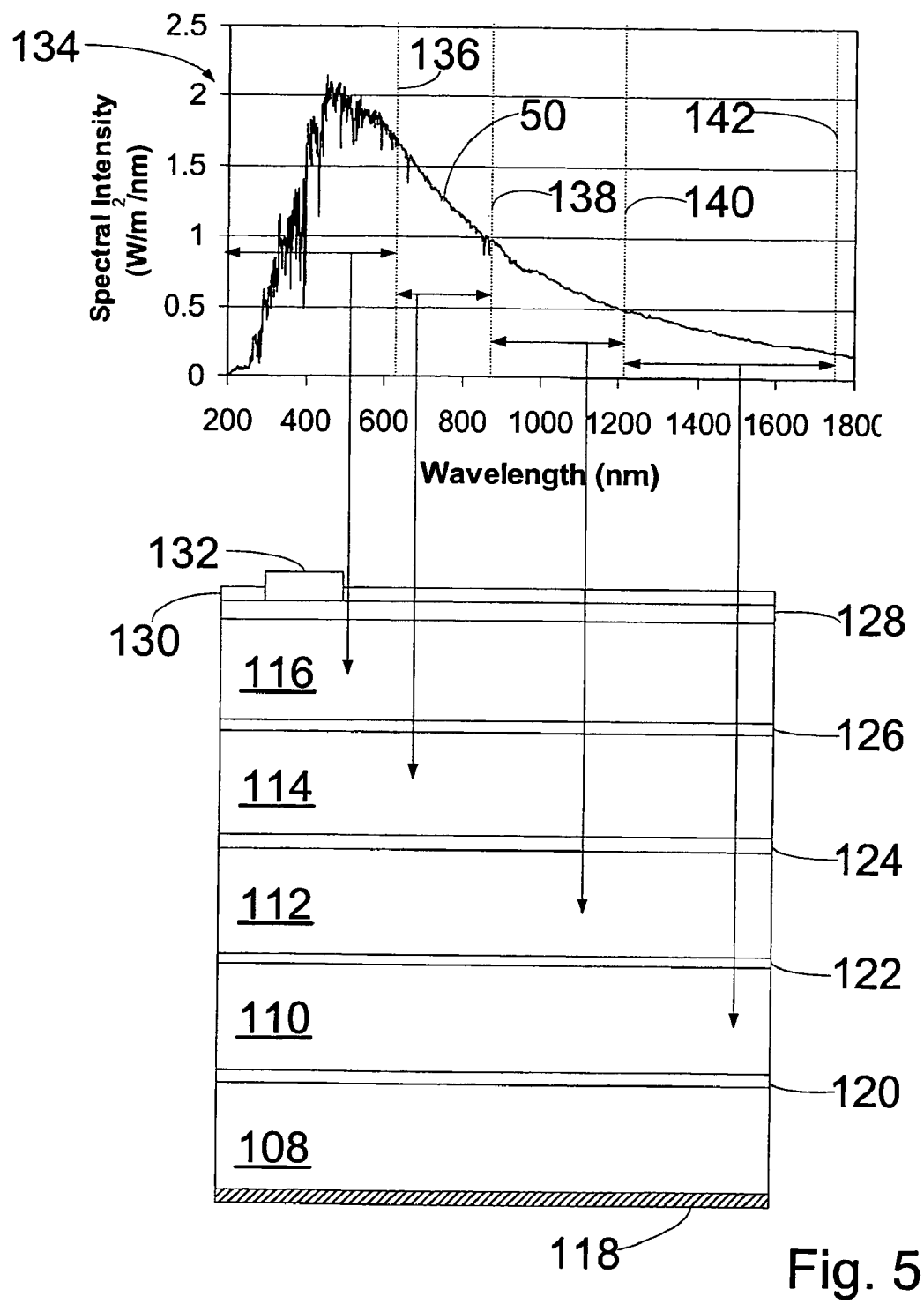
FIG. 5 depicts a monolithic four-subcell photovoltaic solar cell of the present invention.

In this embodiment, substrate 108 can be conductive GaAs or preferably Ge, each of them having a similar lattice constant. The doping of substrate 108 can be n-type or p-type. Whether substrate 108 is n-type with an n-p or an n-i-p junction grown on top or, p-type with a p-n or a p-i-n junction grown on top, is not fundamental to the present invention. For illustration purposes, this embodiment will use an n-type substrate with n-p or n-i-p junctions. Other possible combinations, which could include an undoped substrate and buried back contacts, are equally possible. In the final steps of the process, substrate 108 may be metallized to form ohmic contact 118, as illustrated in FIG. 5.

A buffer and/or back field layer 120 can be fabricated on substrate 108 prior to the growth of first subcell 110 to optimize various structural, electrical, or optical properties. First subcell 110 is preferably made of Ge and includes an n-p junction to provide a depletion region. Tunnel junction 122 is used to connect first subcell 110 with second subcell 112. As will be readily understood by a person skilled in the art, tunnel junction 122 is preferably made of a high quality material which can be epitaxially grown on first subcell 110 and is highly doped to provide good electrical conduction and to support high current densities. Tunnel junction 122, as all tunnel junctions described herein, is preferably substantially transparent to photons traversing it.

For this embodiment the tunnel junction 122 can be made of a highly doped GaAs n-p junction but other types of tunnel junctions are possible such as AlGaAs, or alloys of AlGaInAsP with a lattice constant close to that of GaAs. As previously stated, second subcell 112 comprises self-assembled In(Ga)As/GaAs quantum dot material tailored to obtain an effective bandgap of about 1.0 eV. The details of second subcell 122 are similar to the ones disclosed in FIG. 4 and its corresponding description, but with modifications as far as the growth parameters of the self-assembled quantum dot material. Further details regarding the growth of second subcell 112 appear below. For now, suffice to say that second subcell 112 comprises a self-assembled quantum dot material and an n-p or n-i-p junction. The self-assembled quantum dot material includes a plurality of layers with high quality self-assembled In(Ga)As/GaAs quantum dots of specified shape, composition, and density grown pseudomorphically by epitaxy.

Second subcell 112 is connected to third subcell 114 via tunnel junction 124. Tunnel junction 124 is preferably made of a high quality material, which can be epitaxially grown on third cell 112 and is highly doped to provide good electrical conduction and to support high current densities. Tunnel junction 124 is substantially transparent to photons traversing it. In this embodiment, tunnel junction 124 can be made of a highly doped GaAs, InGaP, AlGaAs, or AlGaInAsP n-p junction, the alloy used having a lattice constant close to that of GaAs and a bandgap equal or greater than that of GaAs.

Third subcell 114 is essentially an n-p junction preferably made of doped. GaAs or of an AlGaInAsP or GaInNAs alloy latticed-matched to GaAs and having a bandgap around 1.4 eV. For some configurations, to help balance the current of the subcells, it might be desirable to adjust the thickness and absorption characteristics of third subcell 114 such that third subcell 114 lets part of the light impinging on it reach second subcell 112. Third subcell 114 is connected to fourth subcell 116 via tunnel junction 126 which can be made of a highly doped InGaP or AlGaAs n-p junction but other alloys supporting the requirements mentioned above are equally valid, for example AlInGaP or ZnSe alloys.

Fourth subcell 116 is essentially an n-p junction preferably made of doped GaInP or AlGaAs, or a similar AlGaInAsP alloy latticed-matched to GaAs, and has a bandgap around 1.8 eV. Preferably, the thickness and absorption characteristics of fourth subcell 116 are such that fourth subcell 116 lets part of the light impinging on it reach third subcell 114. Furthermore, fourth subcell 116, third subcell 114, second subcell 112 and first subcell 110 are such that the respective currents generated by photons absorbed by the respective cells are balanced. Fourth subcell 116 may include window 128, antireflection coating 130, and electrical contact 132, as is customary in the fabrication of multijunction solar cells.

The top part of FIG. 5 shows graph 134 of the spectral intensity as a function of wavelength for solar spectrum 50. FIG. 5 also illustrates absorption ranges 136, 138, 140 and 142 of solar spectrum 50 for fourth subcell, 116, third subcell 114, second subcell 112 and first subcell 110 respectively. It will be clear for someone skilled in the art, with the help of the description of FIG. 1, that such a four-junction photovoltage solar cell will have good current matching between the subcells with about 19% of the solar photon flux absorbed in each subcell, and consequently, high conversion efficiencies.

A measured photovoltaic spectrum of a high quality self-assembled quantum dot material grown within a p-i-n junction and having an absorption band edge of about 1.0 eV is shown as plot 70 in FIG. 3. There, plot 70, measured at 20° C., shows spectral features associated with the quantum dot ground states 71, the quantum dot excited states 72 and the wetting layer states 76. This particular sample contains one single layer of In(Ga)As quantum dots embedded in GaAs barriers.

The growth conditions of second subcell 112 can be adjusted so that the size and the composition of the quantum dots, together with the composition of the material adjacent to the quantum dots, yield a self-assembled quantum dot material with an absorption edge at an energy lower than 1.16 eV at about 1.0 eV. As discussed previously, there are many combinations of growth parameters that can accomplish the desired goal. However, for illustration purposes of the embodiment just described, the desired absorption characteristics of self-assembled quantum dot material 94 can be obtained by growing InAs on GaAs, the thickness of InAs being comprised preferably between 0.4 nm and 0.8 nm, and most preferably between 0.50 nm and 0.58 nm. The preferred growth rate of InAs is comprised between 0.001 and 3 nm/s and more preferably between 0.01 and 0.03 nm/s, with a growth pause following the InAs growth, the growth pause preferably ranging from 0 second to 300 seconds. The growth of the InAs quantum dot layer is followed by the over-growth of a barrier layer having a thickness ranging from 6 nm to 50 nm, the barrier layer preferably being a GaAs or an AlGaAs alloy with Al composition smaller than about 10% having a slightly higher bandgap. The growth sequence of quantum dot layer and barrier layers is repeated a number of times as previously stated. The preferred number of quantum dot layers is between 50 and 150 layers, or as required to balance the absorption in the subcells.

As mentioned above, a specific temperature cycling of substrate 108 may be used to adjust the shape, composition, and uniformity of the quantum dots during the overgrowth of the quantum dot layer. In this case, the temperature of substrate 108 is increased preferably above the InAs disorption temperature and decreased back to its nominal value before the growth of the subsequent quantum dot layer. In this case where the desired absorption edge is about 1.0 eV, the temperature cycling performed during the over-growth may occur when the thickness of the barrier is comprised between 1 nm and 50 nm, and preferably between 2.0 nm and 10.0 nm, and most preferably between 7.5 nm and 10.0 nm. Alternatively, alloys of slightly lower bandgap material than GaAs such InGaAs with low concentration of indium, or graded bandgap materials, can also be used adjacent to the quantum dot layers to extend absorption to longer wavelengths.

A method for incorporating self-assembled quantum dot material within a subcell of a multijunction monolithic photovoltaic solar cell may comprise the steps of: providing a substrate having a top surface with a lattice constant; providing a subcell, lattice-matched to said lattice constant, upon the previous layer; providing a tunnel junction, lattice-matched to said lattice constant, upon the previous subcell and repeating the last two steps until the subcell comprising self-assembled quantum dot material has to be incorporated. The last two steps are omitted if the self-assembled quantum dot material has to be incorporated in the bottom subcell. Further steps include: epitaxially depositing buffer layers, upon the previous layer, of semiconductor materials that are lattice-matched to the said lattice constant and having a buffer dopant concentration; epitaxially depositing back field layers, upon said buffer layers, of a semiconductor materials that are lattice-matched to the said lattice constant and having a back field dopant concentration; epitaxially depositing a first barrier layer, upon said back field, of a semiconductor material that is lattice-matched to the said lattice constant, and having a barrier dopant concentration and a barrier thickness grown at a barrier temperature. Additional steps are: epitaxially depositing a quantum dot layer, comprising a high density of uniform self-assembled quantum dots with a low density of defects and having a shape and a size, upon previous barrier, using a semiconductor with a nominal composition for the quantum dots, that is highly strained to the said lattice constant, and having a quantum dot dopant concentration, a quantum dot thickness, a quantum dot growth temperature, a quantum dot growth rate, a quantum dot group V overpressure or III-V ratio; epitaxially depositing a barrier layer, upon the previous quantum dot layer, after pausing the growth for a growth interruption time, of a semiconductor material that is lattice-matched to the said lattice constant, having a barrier dopant concentration, a barrier thickness, a barrier growth rate, and a barrier temperature profile for the temperature of the substrate during the overgrowth of the quantum dots; and repeating the last 2 steps for a number of periods, wherein said composition, said size, and said shape of the quantum dots are controlled and can be changed throughout the stacking profile via the growth parameters. More steps include: epitaxially depositing top field layers, upon the previous barrier layer, of semiconductor materials that are lattice-matched to the said lattice constant and having a top field dopant concentration; epitaxially depositing a tunnel junction, upon said top field layers, of highly doped semiconductor materials that are lattice-matched to the said lattice constant and having a dopant concentration that is of the same type as said top field dopant for the initial part of the tunnel junction and abruptly changed to the opposite type for the final part of the tunnel junction; providing a subcell lattice-matched to said lattice constant upon the previous tunnel junction providing a tunnel junction lattice-matched to said lattice constant upon the previous subcell and repeating the last 2 steps to complete the number of subcells comprised in the said multijunction solar cell. Finally, the method includes: providing a window upon the top subcell, providing an antireflection coating upon said window and providing a contact layer connected to said top subcell. In the method just described, the dopant concentration of the said buffer layers is between $1\times10^{16}$ cm$^{-3}$ and $1\times10^{19}$ cm$^{-3}$, said dopant concentration of the said back field layers is between $1\times10^{16}$ cm$^{-3}$ and $1\times10^{19}$ cm$^{-3}$, said barrier dopant concentration is between $1\times10^{13}$ cm$^{-3}$ and $1\times10^{17}$ cm$^{-3}$, said quantum dot thickness is between 0.4 nm to 5.0 nm, said quantum dot growth temperature is between 450° C. and 540° C., said quantum dot growth rate is between 0.0001 nm/s and 0.2 nm/s, said growth interruption time is between 0 s and 600 sec, said barrier temperature profile is either constant or varying between 450° C. and 650° C., said barrier growth rate is between 0.01 nm/s and 1 nm/s, said barrier thickness is between 3 nm and 60 nm, said dopant concentration of the said top field layers is between $1\times10^{16}$cm$^{-3}$ and $1\times10^{19}$cm$^{-3}$. The lattice constant may be the lattice constant of GaAs, the alloy compositions of said buffer layers, said back field layers, said barrier material, and said top field layers, are between that of $Al_{0.3}Ga_{0.7}As$ and GaAs, and said nominal composition of the quantum dots is between that of $In_{0.3}Ga_{0.7}As$ and InAs; the lattice constant may be the lattice constant of GaAs, the alloy compositions of said buffer layers, said back field layers, said barrier material, and said top field layers, are between that of $Al_{0.9}Ga_{0.1}As$ and $Al_{0.1}Ga_{0.9}As$, and said nominal composition of the quantum dots is between that of $In_{0.3}Al_{0.7}As$ and InAs; or, the lattice constant may be the lattice constant of GaAs, the alloy compositions of said buffer layers, said back field layers, said barrier material, and said top field layers, are that of GaAlInP alloys latticed-matched to GaAs, and said nominal composition of the quantum dots is InP.

A third embodiment of the invention provides high efficiency monolithic dual-junction photovoltaic solar cells. In another embodiment, a self-assembled quantum dot material is adapted to be used in a dual-junction solar cell. In order to have a high efficiency photovoltaic dual-junction solar cell, a first subcell having a self-assembled quantum dot material similar to self-assembled quantum dot material 94, but with an absorption edge at 0.92 eV, is required together with a second subcell having a material absorbing photons with energies greater than about 1.6 eV. The second subcell may also include a self-assembled quantum material similar to self-assembled quantum dot material 94. Such a dual-junction solar cell would have balanced currents generated in each subcell. Furthermore, each subcell would absorb about 31% of the total solar photon flux, as shown on plot 10 in FIG. 1 where bandgap 15 (1.6 eV) and bandgap 23 (0.92 eV) are depicted.

Figure 6:
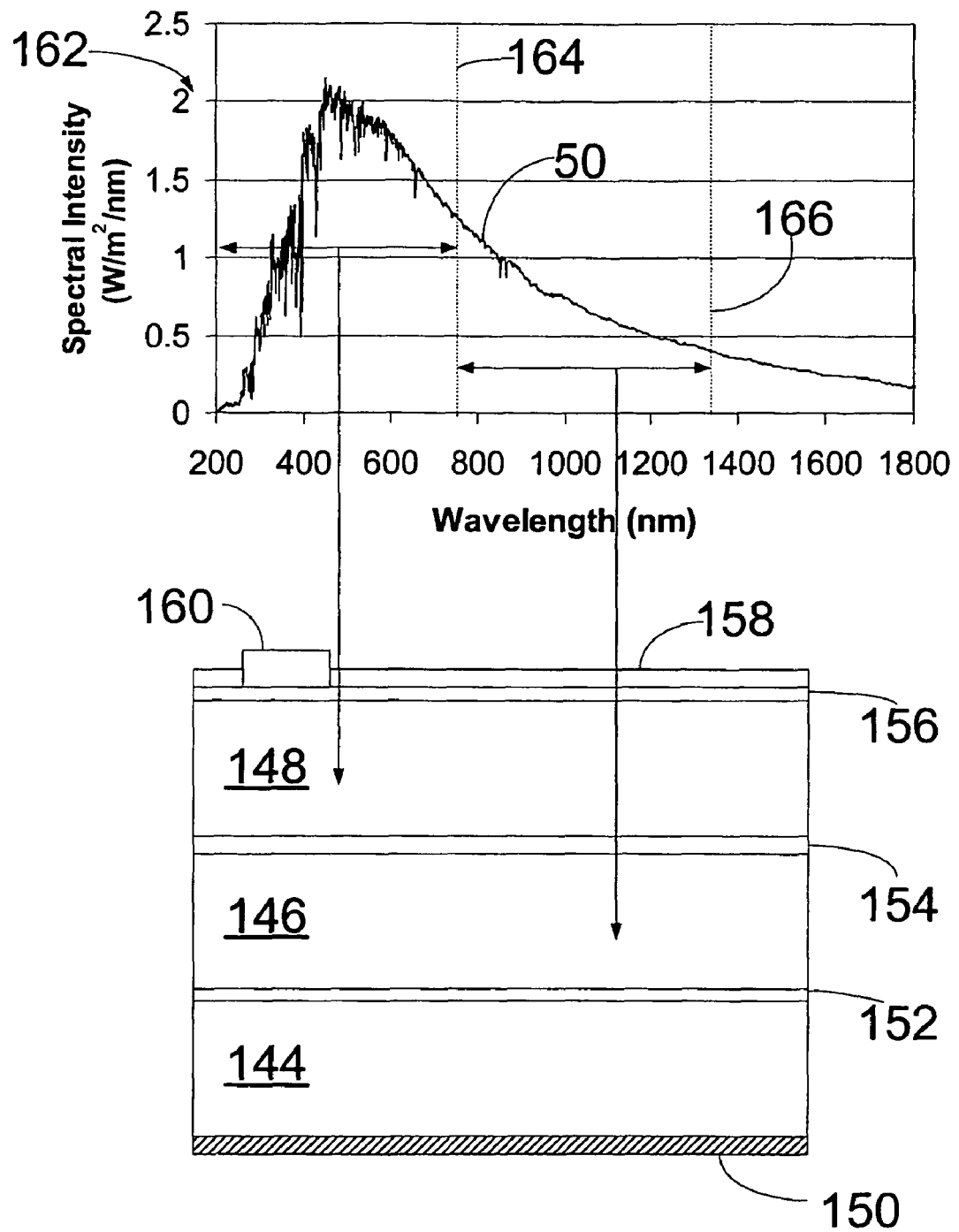
FIG. 6 depicts a monolithic two-subcell photovoltaic solar cell of the present invention.

A dual-junction photovoltaic solar cell of the present invention is depicted in FIG. 6. The dual-junction solar cell comprises a substrate 144 upon which a first subcell 146 is pseudomorphically grown by epitaxy and comprises a first self-assembled In(Ga)As/GaAs quantum dot material, tailored to obtain an effective bandgap of about 0.92 eV. The details of first subcell 146 are similar to the ones of second subcell 30 of FIG. 2, disclosed in FIG. 4 and its corresponding description. A second subcell 148 is pseudomorphically grown by epitaxy on first subcell 146 and may comprise a second self-assembled quantum dot material, preferably having AlInAs/AlGaAs quantum dots, and tailored to obtain an effective bandgap of about 1.6 eV. In this embodiment, substrate 144 is preferably a conductive GaAs substrate or a conductive Ge substrate, each of them having a similar lattice constant.

As discussed previously for other multijunction embodiments, the doping of substrate 144 can be n-type or p-type. Whether substrate 144 is n-type with an n-p or an n-i-p junction grown on top or, p-type with a p-n or a p-i-n junction grown on top, is not fundamental to the present invention. For illustration purposes, this embodiment will use an n-type substrate with n-p or n-i-p junctions. Other possible combinations, which could include an undoped substrate and buried back contacts, are equally possible. In the final steps of the process, substrate 144 may be metallized to form ohmic contact 150, as illustrated in FIG. 6.

A buffer and/or back field layer 152 can be grown on substrate 144 prior to growth of first subcell 146 in order to optimize various structural, electrical, or optical properties. First subcell 146 is electrically connected to second subcell 148 via tunnel junction 154. In this embodiment tunnel junction 154 may comprise a highly doped InGaP, or AlGaAs n-p junction having a bandgap greater than about 1.7 eV. Alternatively, other similar AlInGaAsP alloys can be used. Second subcell 148 is essentially an n-p or an n-i-p junction pseudomorphically grown by epitaxy. As stated above, second subcell 148 may comprise a self-assembled AlInAs/AlGaAs quantum dot material, tailored to obtain an effective bandgap of about 1.6 eV. Alternatively, second cell 148 may be made of doped bulk GaInP or AlGaAs or other similar InAlGaAsP alloys having an alloy composition giving a bandgap of about 1.6 eV. Second subcell 148 may have window 156, antireflection coating 158, and electrical contact 160, as is customary in the fabrication of multijunction solar cells.

The top part of FIG. 6 shows a graph 162 of the spectral intensity as a function of wavelength for solar spectrum 50. Graph 162 also illustrates absorption ranges 164 and 166 of solar spectrum 50 for first cell 146 and second cell 148 respectively. It will be clear for someone skilled in the art, with the help of the description of FIG. 1, that such a dual-junction photovoltage solar cell will have good current matching between the subcells together with high conversion efficiencies.

For this embodiment, the structure of subcells having a self-assembled quantum dot material layer structure would be similar to that disclosed in FIG. 4 and its associated description. However, the growth conditions are changed to obtain the desired optical, electrical and structural properties. In particular, the size and the composition of the quantum dot or the material adjacent to the quantum dots are modified to extend the absorption of the self-assembled quantum dot material to longer wavelengths for first subcell 146, and to shorter wavelengths for second subcell 148. As discussed previously, there are many combinations of parameters that can accomplish the desired goal.

For illustrations purposes of the present embodiment, the desired absorption characteristics of the self-assembled quantum dot material of first cell 146 can be obtained by growing InAs on GaAs, the thickness of InAs being comprised between 0.5 and 0.8 nm, preferably between 0.50 and 0.58 nm. The preferred growth rate of InAs is comprised between 0.001 and 3 nm/s, more preferably between 0.01 and 0.03 nm/s, with a growth pause following the InAs deposition (growth), the growth pause preferably ranging from 0 to 300 seconds. The growth of the InAs quantum dot layer is followed by the over-growth of a barrier layer having a thickness ranging from 6 nm to 50 nm, the barrier layer preferably being a GaAs layer or an alloy having a similar bandgap. The growth sequence of quantum dot layer and barrier layers is repeated a number of times as stated previously.

As mentioned above, a specific temperature cycling of substrate 144 may be used to adjust the shape, composition, and uniformity of the quantum dots during the overgrowth of the quantum dot layer. In this case, the temperature of substrate 144 is increased preferably above the InAs disorption temperature and decreased back to its nominal value before the growth of the subsequent quantum dot layer. In the case where the desired absorption edge is about 0.92 eV, the temperature cycling performed during the over-growth may occur when the thickness of the barrier is comprised between 1 and 50 nm, preferably between 2 and 11 nm, more preferably between 7.5 and 11 nm. Additionally, alloys of slightly lower bandgap material than GaAs such as InGaAs with low concentration of indium, or graded bandgap material, can also be grown adjacent to the quantum dot layer in order to extend the absorption to longer wavelengths.

A similar method is used to obtain the self-assembled quantum dot material having the desired properties for second subcell 148; however, AlInAs quantum dots are used instead of InAs quantum dots and the GaAs barrier material is replaced by an AlGaAs barrier material. The nominal percentage of Al in the barrier can be between 0% and 100%, but is preferably between 0% and 35%, in order to maintain a direct bandgap material. More preferably, the Al percentage is comprised between 25% and 35%. The nominal percentage of In in the quantum dots can be between 35% and 100%, but is preferably between 50% and 75%, and more preferably between 55% and 70%. The thickness of AlInAs used to form the self-assembled quantum dot layer is preferably comprised between 0.7 nm and 1.2 nm, and more preferably between 0.8 nm and 0.9 nm.

Alternatively, for second subcell 148, an equivalent structure can be fabricated by using InP quantum dots instead of AlInAs quantum dots and GaInP barriers instead of AlGaAs barriers. Other alloys latticed-matched to GaAs, such as GaAlInP or GaInPAs, can be used in the barriers.

The present invention can be applied to other embodiments and materials, for example, a dual-junction monolithic solar cell grown on an InP substrate. This dual-junction cell has a first subcell, which is essentially an n-p or n-i-p junction, preferably comprising InAs quantum dot material within InGaAs barriers lattice-matched to InP. The dual-junction cell also has a second subcell, which is essentially an n-p junction preferably made of doped bulk AlInAs or of a similar alloy latticed-matched to InP such as AlInGaAs or GaInPAs. The first subcell of this embodiment has an extended absorption range compared to Ge since it absorbs photons of energies as small as about 0.65 eV. The disposition of the first and second subcells is the same as depicted in FIG. 6. The second subcell may be optional in some further embodiments. In an embodiment where the second subcell is optional, a lower conversion efficiency might be obtained, but to the benefit of a simpler manufacturing and lower cost and/or higher radiation or defect hardness.

Another embodiment of interest uses a germanium substrate to form a high efficiency dual-junction monolithic photovoltaic solar cell. Here again, the disposition of the first and second subcells is as depicted in FIG. 6. A first subcell, which is essentially an n-p or n-i-p junction, is made of Ge pseudomorphically grown on the Ge substrate by epitaxy or other similar deposition, implantation, or interdiffusion techniques as discussed for subcell 110 of FIG. 5. The second subcell, which is essentially an n-p or n-i-p junction, preferably comprises InGaAs quantum dot material within AlGaAs barriers (or similar alloys such as, for example, AlGaP alloys) pseudomorphically grown by epitaxy with a lattice constant close to that of Ge. Such a dual-junction cell using a Ge substrate might not be as efficient as other possible embodiments discussed herein but, will benefit from simpler manufacturing, higher flexibility from the wide combination of choices for the barrier layers and of the quantum dot layers, and from higher radiation and defect robustness leading to higher end-of-life efficiencies.

Another embodiment particularly interesting uses a silicon substrate to form a high efficiency dual-junction monolithic photovoltaic solar cell. Here again, the disposition of the first and second cells is as depicted in FIG. 6. A first subcell, which is essentially an n-p or n-i-p junction, preferably comprises Ge or SiGe quantum dot material and Si barriers pseudomorphically grown on the Si substrate by epitaxy or other similar deposition techniques. Thin film methods or combinations of methods for growing semiconductor crystals can also be used. The second subcell, which is essentially an n-p or n-i-p junction, preferably comprises InP quantum dot material within GaP barriers (or similar alloys such as such as AlGaP) pseudomorphically grown on Si by epitaxy. The dual-junction cell using a Si substrate can also be designed to use self-assembled quantum dot material in the second sub-cell grown on a conventional crystalline or polycrystalline Si first cell in order to obtain improved efficiencies. The second subcell may be optional in some further embodiments. In an embodiment where the second subcell is optional, a lower conversion efficiency might be obtained, but to the benefit of a simpler manufacturing and lower cost.

As mentioned above, self-assembled quantum dot materials have been shown to produce devices that are orders of magnitude more radiation and defect robust. The higher radiation and defect robustness is a consequence of the combination of: (A) spatial confinement isolating regions with defects, (B) favourable diffusion length damage coefficient due to the nanostructures, (C) elimination of current limiting restrictions in the subcells most affected by radiation, and (D) solar cell design without a current-limiting cell. This makes devices having self-assembled quantum material particularly attractive for space applications. The solar cells of the embodiments describe above would benefit from radiation hardness in applications where the devices are exposed to radiations. For example, an optimized solar cell will have a beginning-of-life efficiency of about 40%. Assuming that this optimized solar cell has a radiation hardness improved by two orders of magnitude with respect to conventional solar cells, the end-of-life efficiency would be higher than 38% for an end-of-life defined as the equivalent to a total dose of $1 \times 10^{15} cm^{-2}$ of 1 MeV electron radiation.

It can be desirable to have embodiments of the present invention that exploit and/or to optimize the defect hardness, even while partially sacrificing some of the conversion efficiency. For example, a dual-junction solar cell may include a Si substrate upon which is metamorphically grown a plurality of GaAs/AlGaAs layers to make a transition buffer layer. On this transition buffer layer is epitaxially grown a first subcell comprising self-assembled In(Ga)As/GaAs quantum dot material, tailored to obtain an effective bandgap of about 0.92 eV. A second subcell, which could be optional in some embodiments, is grown by epitaxy on the first subcell and may comprise self-assembled quantum dot material preferably made of AlInAs/AlGaAs quantum dots, and adapted to obtain an effective bandgap of about 1.6 eV. In this embodiment, a significant concentration of defects will be presence due to the large lattice mismatch between Si and GaAs. However, the conversion efficiency could be acceptable for some applications due to the defect hardness of the self-assembled quantum dot material.

In addition to defect hardness, other advantages of the invention may be realized. For example, a self-assembled quantum dot material can enhance the conversion efficiency by recovering some of the photon energy that is in excess of the semiconductor bandgap, which would otherwise be lost when photons having higher energies than the effective bandgap impinge on the multifunction solar cell. As is well known, the energy in excess of the effective bandgap can generate phonons. Some of these phonons will be re-absorbed within the quantum dots and be used in thermionic emission processes by raising photocarriers from confined quantum dot states to higher, unconfined, states, before being swept across the depletion region. Hence the higher efficiency.

Figure 7:
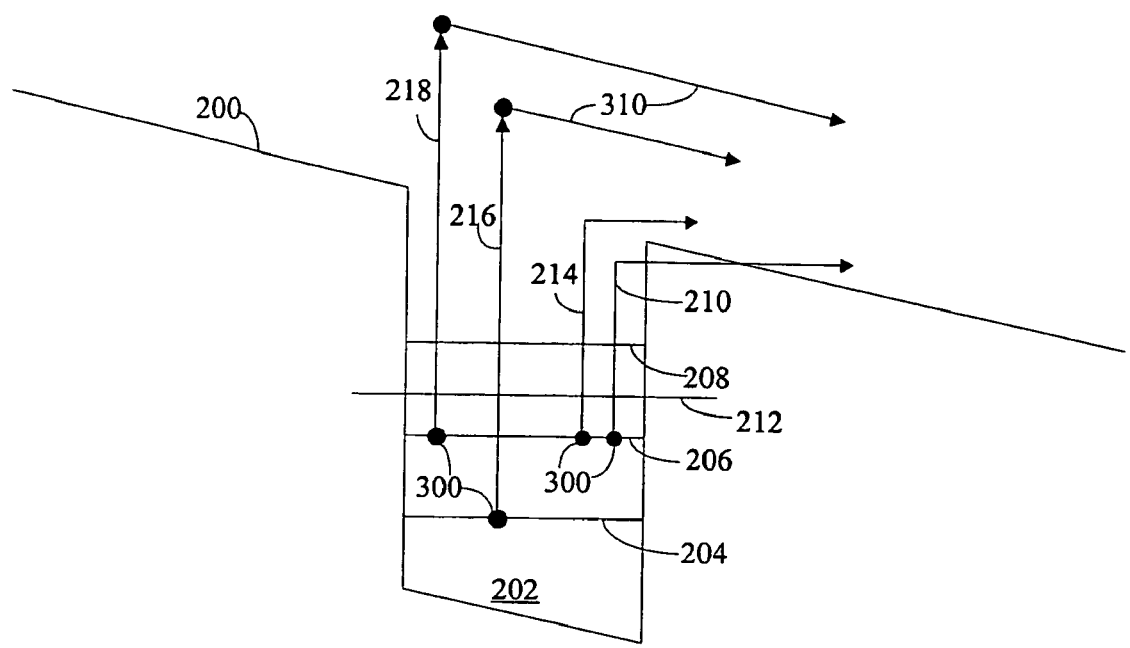
FIG. 7 depicts a conduction band of a quantum dot.

Other, similar schemes to optimize the conversion efficiency can be incorporated in embodiments of the invention. For example, self-assembled quantum dot materials can be doped with a controlled residual doping to act as detectors in the longer infrared wavelengths. Detection processes would use intraband absorption simultaneously with the interband transitions, and therefore increase the subcell currents by using a larger fraction of the total solar photon flux. This is shown in FIG. 7 where a biased conduction band edge 200 is shown to form a potential well 202 at a quantum dot. Electronic quantized energy levels 204, 206 and 208 are shown in potential well 202 together with the quasi-Fermi level 212. Electrons 300 are shown to populate levels 204 and 206. Long wavelength infrared intraband absorption transitions (shown as 216 and 218), which are not normally present in solar cells, create additional photocarriers that drift in the device as shown by arrows 310. This type of absorption could be significant since approximately 20% of the solar photon flux is in the energy range lying below the Ge bandgap.

The proposed approach can also be extended to other embodiments and material systems. For example semiconductor self-assembled quantum dots containing diluted nitrides such as InGaAsN or similar semiconductor alloys containing a small fraction of nitrogen, or In(Ga)N quantum dots within Ga(Al)N barriers, or using antimony-based material system such as InSb self-assembled quantum dots in Ga(Al)Sb barriers or similar alloys. Obviously the invention could also benefit applications other than solar energy conversion, but also requiring the efficient conversion of a broadband source of photons into electrical signals.

A series of different embodiments of the invention have been presented. All the embodiments related to monolithic semiconductor photovoltaic solar cells comprising at least one subcell having a self-assembled quantum dot material. Details on how to tailor the effective bandgap of a subcell having a self-assembled quantum material were given. The tailoring of the bandgap allows for solar cells having higher conversion efficiencies than prior art solar cells. Embodiments including two, three and four subcells were discussed.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A monolithic, multijunction, semiconductor photovoltaic solar cell comprising:
    an electrically conductive substrate selected from the group consisting of an electrically conductive Ge substrate and an electrically conductive GaAs substrate;
    a first subcell including Ge, an effective bandgap energy of the first subcell being about 0.7 ev;
    a second subcell including a plurality of epitaxially-grown semiconductor layers that include layers with self-assembled InGaAs quantum dots, the layers with the self-assembled InGaAs quantum dots being intercalated with GaAs, AlGaAs, or GaPAs layers, an effective bandgap energy of the second subcell being about 1.16 eV; and
    a third subcell including GaInP, AlGaAs or AlGaInP, the effective bandgap energy of the third subcell being about 1.8 eV, the first, second, and third subcells being disposed in series and each having a p-n or p-i-n junction formed therein, the first, second, and third subcells being disposed on the electrically conductive substrate with first subcell being disposed closest to the electrically conductive substrate, the third subcell being the farthest from the electrically conductive substrate, and the second subcell being disposed between the first subcell and the second subcell.

2. The solar cell of claim 1, further comprising:
tunnel junctions formed between the subcells, the tunnel junctions for electrically connecting the subcells.

3. The solar cell of claim 1, wherein each of the first, second, and third subcells is for absorbing a substantially same fraction of solar photons.

4. The solar cell of claim 1 wherein the first subcell is epitaxially grown.

5. The solar cell of claim 1 wherein the electrically conductive substrate is the electrically conductive Ge substrate and the first subcell is an interdiffused portion of the electrically conductive Ge substrate.

6. The solar cell of claim 1 wherein:
the electrically conductive substrate is n-doped; and
an n-side of each of the p-n junction or p-i-n junction formed in each of the first, second, and third subcells is closer to the substrate than a respective p-side of the p-n junction or the p-i-n junction.

7. The solar cell of claim 1 wherein:
the electrically conductive substrate is p-doped; and
a p-side of the p-n junction of p-i-n junction formed in each of the first, second, and third subcells is closer to the substrate than a respective n-side of the p-n junction or p-i-n junction.

8. The solar cell of claim 1 wherein:
one of the first, second and third subcells includes a Bragg reflector or a distributed Bragg reflector to modify an absorption characteristic of the solar cell.

9. A monolithic, multijunction, semiconductor photovoltaic solar cell comprising:
an electrically conductive substrate selected from the group consisting of an electrically conductive Ge substrate and an electrically conductive GaAs substrate;
a first subcell having an effective bandgap energy of about 0.7 eV;
a second subcell having an effective bandgap energy of about 1.0 eV;
a third subcell having an effective bandgap energy of about 1.4 eV; and
a fourth subcell having an effective bandgap energy of about 1.8 eV, the first, second, third, and fourth subcells being disposed in series on the electrically conductive substrate in order of increasing effective bandqap energy, the first subcell being closest to the electrically conductive substrate, each of the first, second, and third subcells having a p-n or p-i-n junction formed therein, at least one of the first, second, third, and fourth subcells having an epitaxially-grown semiconductor layer that includes self-assembled quantum dots.

10. The solar cell of claim 9 wherein:
the first subcell includes Ge;
the second subcell includes a plurality of epitaxially-grown semiconductor layers that include self-assembled InGaAs quantum dot layers intercalated with GaAs, AlGaAs, or GaPAs layers;
the third subcell includes GaAs or AlGaAs; and
the fourth subcell includes GaInP or AlGaAs.

11. The solar cell of claim 10 wherein:
the electrically conductive substrate is n-doped; and
an n-side of the p-n junction or p-i-n junction formed in each subcell is closer to the electrically conductive substrate than a respective p-side of the p-n junction or p-i-n junction.

12. The solar cell of claim 10 wherein:
the electrically conductive substrate is p-doped; and
a p-side of the p-n junction or p-i-n junction formed in each subcell is closer to the electrically conductive substrate than a respective n-side of the p-n junction or p-i-n junction.

13. A monolithic, multijunction, semiconductor photovoltaic solar cell comprising:
an electrically conductive substrate selected from the group consisting of an electrically conductive Ge substrate and an electrically conductive GaAs substrate;
a first subcell including a first plurality of epitaxially-grown semiconductor layers that include self-assembled quantum dots; and
a second subcell having an effective bandgap of about 1.6 eV, the effective bandgap of the first subcell being smaller than the effective bandgap of the second subcell, the first and second subcells being disposed in series on the electrically conductive substrate in order of increasing effective bandgap energy, the first subcell being closest to the electrically conductive substrate, each of the first and second subcells having a p-n or p-i-n junction formed therein.

14. The solar cell of claim 13, wherein the first and the second subcells are for absorbing a substantially same fraction of solar photons.

15. The solar cell of claim 14, wherein:
the first plurality of epitaxially-grown semiconductor layers includes InGaAs quantum dot layers intercalated with GaAs or AlGaAs layers, the effective bandgap energy of the second subcell being about 0.92 eV; and
the second subcell includes GaInPAs or AlGaAs.

16. The solar cell of claim 14, wherein:
the first plurality of epitaxially-grown semiconductor layers includes InGaAs quantum dot layers intercalated with GaAs or AlGaAs layers, the effective bandgap energy of the second subcell being about 0.92 eV; and
the second subcell includes a second plurality of epitaxially-grown semiconductor layers that includes self-assembled InAlAs quantum dot layers intercalated with AlGaAs layers.

17. A monolithic, multijunction, semiconductor photovoltaic solar cell comprising:
an electrically conductive substrate selected from the group consisting of an electrically conductive Ge substrate and an electrically conductive GaAs substrate;
a first subcell including a first plurality of epitaxially-grown semiconductor layers that include self-assembled InGaAs quantum dot layers intercalated with GaAs or AlGaAs layers; and
a second subcell including a second plurality of epitaxially-grown semiconductor layers that include self-assembled InP quantum dot layers intercalated with AlGaInP layers, the first and second subcells being disposed in series on the electrically conductive substrate in order of increasing effective bandgap energy, one of the first subcell and the second subcell with a lowest effective bandgap enerqy being closest to the electrically conductive substrate, each of the first and second subcells having a p-n or p-i-n junction formed therein.

18. A monolithic, multijunction, semiconductor photovoltaic solar cell comprising:

an electrically conductive substrate selected from the group consisting of an electrically conductive Ge substrate and an electrically conductive GaAs substrate;

a first subcell including Ge; and a second subcell including a plurality of epitaxially-grown semiconductor layers that include self-assembled InGaAs quantum dot layers intercalated with GaAs or AlGaAs layers, the first and second subcells being disposed in series on the electrically conductive substrate in order of increasing effective bandqap energy, one of the first subcell and the second subcell with a lowest effective bandgap enerqy being closest to the electrically conductive substrate, each of the first and second subcells having a p-n or p-i-n junction formed therein.

19. A monolithic, multijunction, semiconductor photovoltaic solar cell comprising:

an electrically conductive InP substrate;

a first subcell including a plurality of epitaxially-grown semiconductor layers that include self-assembled InAs quantum dot layers intercalated with InGaAs layers; and a second subcell including AlGaInAs or InAlAsP, the first and second subcells being disposed in series on the electrically conductive InP substrate in order of increasing effective bandqap energy, one of the first subcell and the second subcell with a lowest effective bandqap enerqy being closest to the electrically conductive InP substrate, each of the first and second subcells having a p-n or p-i-n junction formed therein.

20. A monolithic, multijunction, semiconductor photovoltaic solar cell comprising:

an electrically conductive Si substrate;

a first subcell including a first plurality of epitaxially-grown semiconductor layers that include self-assembled SiGe quantum dot layers intercalated with Si layers; and a second subcell including a second plurality of epitaxially-grown semiconductor layers that include self-assembled InP quantum dot layers intercalated with GaP layers, the first and second subcells being disposed in series on the electrically conductive Si substrate in order of increasing effective bandgap energy, one of the first subcell and the second subcell with a lowest effective bandgap energy being closest to the electrically conductive Si substrate, each of the first and second subcells having a p-n or p-i-n junction formed therein.

21. A monolithic, multijunction, semiconductor photovoltaic solar cell comprising:

an electrically conductive Si substrate with a buffer layer;

a first subcell including a first plurality of epitaxially-grown semiconductor layers that include self-assembled InGaAs quantum dot layers intercalated with GaAs or AlGaAs layers; and a second subcell including a second plurality of epitaxially-grown semiconductor layers that include self-assembled AlInAs quantum dot layers intercalated with AlGaAs or GaAs layers, the first and second subcells being disposed in series on the electrically conductive Si substrate with the buffer layer in order of increasing effective bandgap energy, one of the first subcell and the second subcell with a lowest effective bandqap energy being closest to the electrically conductive Si substrate with a buffer layer, each of the first and second subcells having a p-n or p-i-n junction formed therein.

22. A monolithic, multifunction, semiconductor photovoltaic solar cell comprising:

an electrically conductive Si substrate with a buffer layer;

a first subcell including a first plurality of epitaxially-grown semiconductor layers that include self-assembled InGaAs quantum dot layers intercalated with GaAs or AlGaAs layers; and a second subcell including a second plurality of epitaxially-grown semiconductor layers that include self-assembled InGaAs quantum dot layers intercalated with GaInP layers, the first and second subcells being disposed in series on the electrically conductive Si substrate with the buffer layer in order of increasing effective bandgap energy, one of the first subcell and the second subcell with a lowest effective bandgap energy being closest to the electrically conductive Si substrate with a buffer layer, each of the first and second subcells having a p-n or p-i-n junction formed therein.

* * * * *

UNITED STATES PATENT AND TRADEMARK OFFICE
CERTIFICATE OF CORRECTION

PATENT NO. : 7,863,516 B2
APPLICATION NO. : 11/038230
DATED : January 4, 2011
INVENTOR(S) : Simon Fafard It is certified that error appears in the above-identified patent and that said Letters Patent is hereby corrected as shown below:

Column 18, line 63, delete "GalnP" and insert therefor -- GaInP --

Column 18, line 63, delete "AlGalnP" and insert therefor -- AlGaInP --

Column 19, line 50, delete "bandqap" and insert therefor -- bandgap --

Column 19, line 65, delete "GalnP" and insert therefor -- GaInP --

Column 20, line 34, delete "lnGaAs" and insert therefor -- InGaAs --

Column 20, line 37, delete "GalnPAs" and insert therefor -- GaInPAs --

Column 20, line 59, delete "AlGalnP" and insert therefor -- AlGaInP --

Column 20, line 63, delete "enerqy" and insert therefor -- energy --

Column 21, line 10, delete "bandqap" and insert therefor -- bandgap --

Column 21, line 12, delete "enerqy" and insert therefor -- energy --

Column 21, line 21, delete "AlGalnAs" and insert therefor -- AlGaInAs --

Column 21, line 25, delete "bandqap" and insert therefor -- bandgap --

Column 21, line 26, delete "enerqy" and insert therefor -- energy --

Column 22, line 13, delete "AllnAs" and insert therefor -- AlInAs --

Column 22, line 18, delete "bandqap" and insert therefor -- bandgap --

Signed and Sealed this
Fifth Day of April, 2011

David J. Kappos
*Director of the United States Patent and Trademark Office*

CERTIFICATE OF CORRECTION (continued)
U.S. Pat. No. 7,863,516 B2

Column 22, line 22, delete "multifunction" and insert therefor -- multijunction --

Column 22, line 32, delete "GalnP" and insert therefor -- GaInP --